(12) United States Patent  (10) Patent No.: US 8,000,414 B2
Aono  (45) Date of Patent: Aug. 16, 2011

(54) AMPLITUDE DETECTION APPARATUS

(75) Inventor: Ryuji Aono, Numazu (JP)

(73) Assignee: Toshiba Kikai Kabushiki Kaisha, Tokyo-To (JP)

( * ) Notice: Subject to any disclaimer, the term of this patent is extended or adjusted under 35 U.S.C. 154(b) by 768 days.

(21) Appl. No.: 12/021,606

(22) Filed: Jan. 29, 2008

(65) Prior Publication Data

US 2008/0181338 A1    Jul. 31, 2008

(30) Foreign Application Priority Data

Jan. 30, 2007   (JP) .................................. 2007-020031

(51) Int. Cl.
  *H04L 27/06* (2006.01)
(52) U.S. Cl. ........................................................ 375/340
(58) Field of Classification Search .................. 375/211, 375/222, 227, 231, 316, 340, 345, 371, 376; 341/115, 118, 120, 143, 144
  See application file for complete search history.

(56) References Cited

U.S. PATENT DOCUMENTS

| | | | | |
|---|---|---|---|---|
| 5,315,618 | A * | 5/1994 | Yoshida ........................ | 375/340 |
| 5,764,523 | A * | 6/1998 | Yoshinaga et al. .............. | 702/61 |
| 6,275,259 | B1 * | 8/2001 | Gowda et al. ............. | 348/229.1 |
| 6,765,392 | B1 * | 7/2004 | Jakoby .......................... | 324/633 |
| 7,450,044 | B2 * | 11/2008 | Moore et al. ................... | 341/118 |
| 2003/0206126 | A1 * | 11/2003 | Kubota ......................... | 341/118 |
| 2005/0238072 | A1 * | 10/2005 | Uesaka ...................... | 372/38.02 |
| 2005/0238117 | A1 * | 10/2005 | Washakowski et al. ....... | 375/302 |
| 2006/0036351 | A1 * | 2/2006 | Hopkins ....................... | 700/280 |
| 2006/0077083 | A1 * | 4/2006 | Kiriyama et al. ............. | 341/120 |
| 2006/0268170 | A1 * | 11/2006 | Suzuki et al. ................. | 348/465 |

FOREIGN PATENT DOCUMENTS

JP      6-167354    6/1994

OTHER PUBLICATIONS

H. Sugimoto et al., "Fact of the Theory and Design for AC Servo-System", pp. 142-149 (1990).
English language translation of H. Sugimoto et al., "Fact of the Theory and Design for AC Servo-System", pp. 142-149 (1990).
English language abstract of JP 6-167354, published Jun. 14, 1994.

* cited by examiner

*Primary Examiner* — Dac V Ha
*Assistant Examiner* — Syed Haider
(74) *Attorney, Agent, or Firm* — DLA Piper LLP US (57) ABSTRACT

This disclosure concerns an amplitude detector comprising: a maximum-minimum detector detecting a maximum and a minimum values of a digital signals; a first and a second lowpass filters respectively having a cutoff frequency lower than a frequency of the waveform signal; a cycle detector detecting a cycle of the waveform signal; a correction coefficient generator generating a numeric value of a correction coefficient expressed by a calculation with respect to the cycle of the waveform signal and a cycle of the sampling; a first multiplier generating a corrected maximum value by multiplying the maximum value of the digital signals by the correction coefficient; a second multiplier generating a corrected minimum value by multiplying the minimum value of the digital signals by the correction coefficient; and an output portion outputting the corrected maximum value or an absolute value of the corrected minimum value as the amplitude of the waveform signal.

11 Claims, 8 Drawing Sheets

AMPLITUDE DETECTION APPARATUS

CROSS-REFERENCE TO RELATED APPLICATION

This application is based upon and claims the benefit of priority from the prior Japanese Patent Applications No. 2007-20031, filed on Jan. 30, 2007, the entire contents of which are incorporated herein by reference.

BACKGROUND OF THE INVENTION

1. Field of the Invention

The present invention relates to an amplitude detection apparatus, and, for example, relates to an amplitude detection apparatus incorporated in a machine angle detector or a machine position detector.

2. Related Art

Generally, a rotary encoder is used as a position detector detecting a position of a moving body (e.g., a servo motor) making a rotational movement, or a linear scale is used as a position detector detecting a position of a moving body (e.g., a robot arm) making a linear reciprocating movement for accurately controlling movement of the machine. An output signal from the position detector is periodically subjected to analog-digital conversion (sampling), converted into a value indicating the position, and the resultant digital signal is used. To accurately detect the position of the moving body, it is necessary to accurately detect amplitudes of sine waves (sin wave and cos wave) of the moving body. The amplitudes are conventionally obtained from a maximum value and a minimum value of digital signals (sin signal and cos signal) resulting from the sampling.

However, if the maximum value and the minimum value are selected from among the digital signals obtained discretely by the sampling, they often differ from a maximum value and a minimum value of an actual analog sine wave, respectively. Normally, a sampling cycle is shorter than a sine wave cycle. However, if the sine wave cycle is shortened to thereby reduce a difference between the sine wave cycle and the sampling cycle, it is highly likely that an error increases between the maximum value obtained from the digital signals and that of the actual sine wave and an error increases between the minimum value obtained from the digital signals and that of the actual sine wave.

It is an object of the present invention to provide an amplitude detection apparatus capable of highly accurately detecting an amplitude of a waveform signal even if a difference between a cycle of an analog waveform signal based on a moving body and a sampling cycle of the waveform signal is small.

SUMMARY OF THE INVENTION

An amplitude detection apparatus according to an embodiment of the present invention, the apparatus for periodically sampling a waveform signal indicating an angle or a position of a moving body making a rotational movement or a reciprocating movement, and for detecting an amplitude of the waveform signal based on digital signals obtained by sampling, the apparatus comprises a maximum-minimum value detector detecting a maximum value and a minimum value of the digital signals by using a digital signal at a certain time point and digital signals obtained by the sampling before the certain point; a first lowpass filter having a cutoff frequency lower than a frequency of the waveform signal, and stabilizing the maximum value of the digital signals; a second lowpass filter having a cutoff frequency lower than the frequency of the waveform signal, and stabilizing the minimum value of the digital signals; a cycle detector detecting a cycle of the waveform signal from a plurality of the digital signals; a correction coefficient generator generating a numeric value of a correction coefficient expressed by a calculation with respect to the cycle of the waveform signal and a cycle of the sampling; a first multiplier generating a corrected maximum value by multiplying the maximum value of the digital signals by the correction coefficient; a second multiplier generating a corrected minimum value by multiplying the minimum value of the digital signals by the correction coefficient; and an output portion outputting at least one of the corrected maximum value and an absolute value of the corrected minimum value as the amplitude of the waveform signal.

The amplitude detection apparatus can further comprise a storage portion storing therein a correspondence relationship between the cycle of the waveform signal and the correction coefficient with respect to a predetermined cycle of the sampling, wherein the correction coefficient generator reads the correction coefficient corresponding to the cycle of the waveform signal detected by the cycle detector from the storage portion, and transmits the correction coefficient to the first multiplier and the second multiplier.

The correction coefficient generator calculates an Equation (3):

$$A = \frac{\pi ts}{T\sin\left[\frac{\pi ts}{T}\right]} \quad \text{Equation (3)}$$

where A indicates the correction coefficient, ts indicates the cycle of the sampling, T indicates the cycle of the waveform signal, and the correction coefficient generator transmits the correction coefficient A to the first multiplier and the second multiplier.

The cycle detector measures an interval in which a sign of one of a sin signal and a cos signal included in the digital signals is constant, and calculates the cycle of the waveform signal using the measured interval.

The cycle detector measures an interval in which a sign of one of a sin signal and a cos signal included in the digital signals is constant, and calculates the cycle of the waveform signal using the measured interval.

The cycle detector measures an interval in which a sign of one of a sin signal and a cos signal included in the digital signals is constant, and calculates the cycle of the waveform signal using the measured interval.

The amplitude detection apparatus can further comprise a third lowpass filter provided between the cycle detector and the correction coefficient generator, the third lowpass filter having a cutoff frequency lower than the frequency of the waveform signal.

The amplitude detection apparatus can further comprise a third lowpass filter provided between the cycle detector and the correction coefficient generator, the third lowpass filter having a cutoff frequency lower than the frequency of the waveform signal.

The amplitude detection apparatus can further comprise a third lowpass filter provided between the cycle detector and the correction coefficient generator, the third lowpass filter having a cutoff frequency lower than the frequency of the waveform signal.

The amplitude detection apparatus can further comprise a third lowpass filter provided between the cycle detector and the correction coefficient generator, the third lowpass filter having a cutoff frequency lower than the frequency of the waveform signal.

The amplitude detection apparatus is arranged in a rotary encoder or a linear scale.

The correction coefficient generator is constituted by a logic circuit.

The amplitude detection apparatus according to the present invention can highly accurately detect amplitude of a waveform signal even if a difference between a cycle of an analog waveform signal based on a moving body and a sampling cycle of the waveform signal is small.

DETAILED DESCRIPTION OF THE INVENTION

Embodiments of the present invention will be explained below in detail with reference to the accompanying drawings. Note that the invention is not limited thereto.

Figure 1:
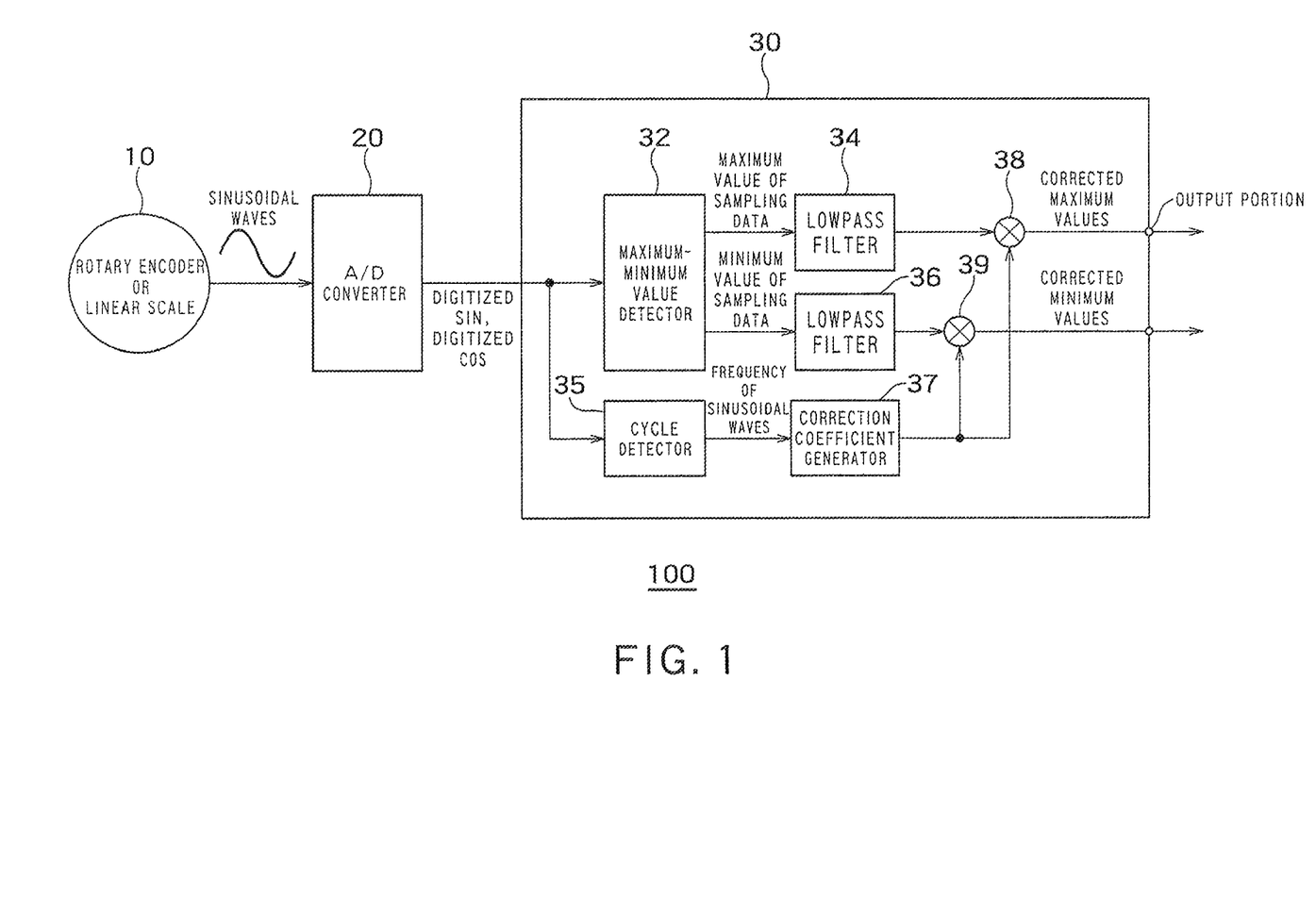
FIG. 1 is a block diagram of a position detection apparatus 100 according to an embodiment of the present invention.

FIG. 1 is a block diagram of a position detection apparatus 100 according to an embodiment of the present invention. The position detection apparatus 100 includes a rotary encoder or a linear scale 10, an A/D converter 20f and an amplitude detection apparatus 30. The amplitude detection apparatus 30 is a general-purpose CPU or a logic LSI. As the amplitude detection apparatus 30, a custom LSI such as an FPGA (Field Programmable Gate Array) or an ASIC (Application Specific Integrated Circuit) can be used. If the amplitude detection apparatus 30 is realized as a logic circuit on the LSI, it is possible to perform a repetition process for repeatedly performing the same process in a short time. Alternatively, the amplitude detection apparatus 30 can be realized by the general-purpose CPU and software. If the amplitude detection apparatus 30 is realized by the general-purpose CPU and the software, it is possible to perform various processes by changing programs.

The position detection apparatus 100 can be provided in, for example, a servo motor including a moving body making a rotational movement or a reciprocating movement. The moving body is, for example, a rotor of the servo motor arranged in a machine tool or an arm thereof making a reciprocating movement. Alternatively, the position detection apparatus 100 can be arranged in, for example, a positioning apparatus using the rotary encoder or linear scale 10.

The rotary encoder or linear scale 10 outputs waveform signals (cos wave and sin wave) indicating an angle or a position of the moving body making a rotational movement or a reciprocating movement. The cos wave and sin wave are analog signals having amplitudes which indicate values in orthogonal phase. The A/D converter 20 periodically samples the cos wave and the sin wave from the rotary encoder or linear scale 10, and converts the analog signals into digital signals. Digitized cos signal and digitized sin signal are thereby generated.

The amplitude detection apparatus 30 receives the digital signals (cos signal and sin signal) and detects amplitudes of the waveform signals. To make the detection, the amplitude detection apparatus 30 includes a maximum-minimum value detector 32, lowpass filters 34 and 36, a cycle detector 35, a correction coefficient generator 37, a multiplier 38 serving as a first multiplication unit, and a multiplier 39 serving as a second multiplication unit.

The maximum-minimum value detector 32 detects a maximum value and a minimum value of digital signals using a digital signal at a certain time point and digital signals obtained by sampling before the certain time point. The maximum value and the minimum value of the digital signals are updated whenever the moving body rotates once or reciprocates once. Since sampling is executed periodically at certain time intervals, a maximum value ymax of the sin signal that is one of the digital signals approximately indicates an apex of the sin wave but does not necessarily indicates an apex value accurately. Accordingly, the maximum value ymax slightly changes for every rotation or reciprocation of the moving body. Due to this, the maximum value ymax is caused to pass through the lowpass filter 34, thereby stabilizing the maximum value ymax. Likewise, a maximum value xmax that is another digital signal is caused to pass through the lowpass filter 34, thereby stabilizing the maximum value xmax. Furthermore, minimum values ymin and xmin of the sin signal and the cos signal are caused to pass through the lowpass filter 36 and thereby stabilized, respectively. Cutoff frequencies of the lowpass filters 34 and 36 are lower than frequencies of the waveform signals. That is why the lowpass filters 34 and 36 can stabilize the maximum values and minimum values of the digital signals. However, the maximum values ymax and xmax and the minimum values ymin and xmin passing through the lowpass filters 34 and 36 do not always indicate maximum values and minimum values of the waveform signals. This problem will be described in detail with below reference to FIGS. 2 and 3.

Figure 2:
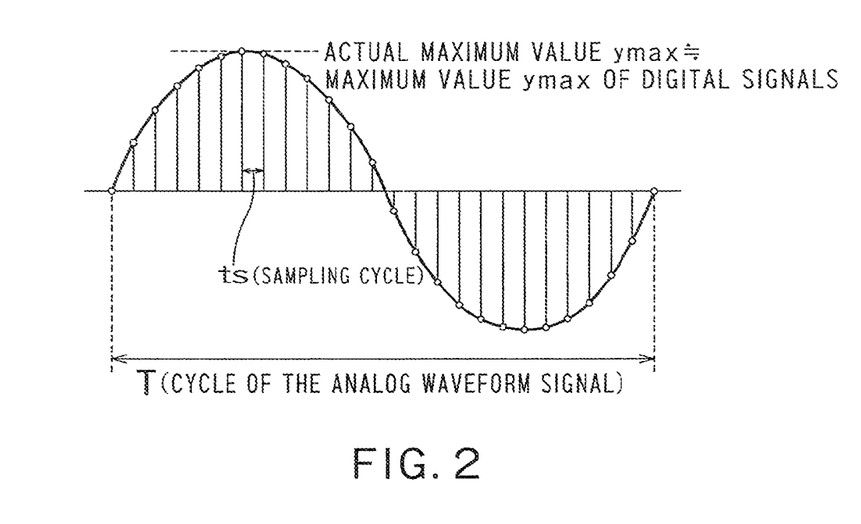
FIGS. 2 and 3 are conceptual diagrams showing an error between the maximum value ymax of the sin signal that is the digital signal and an actual maximum value P of the waveform signal (sin wave) that is the analog signal.
Figure 3:
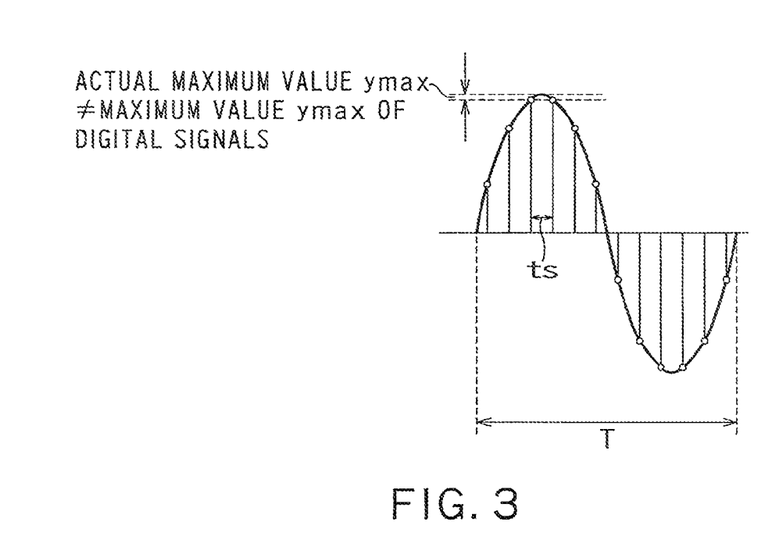

FIGS. 2 and 3 are conceptual diagrams showing an error between the maximum value ymax of the sin signal that is the digital signal and an actual maximum value P of the waveform signal (sin wave) that is the analog signal. While only the sin signal and the sin wave will be described, the same thing is true for the cos signal and the cos wave. Further, while only the maximum values will be described, the same thing is true for the minimum values.

With reference to FIG. 2, a sampling cycle ts is far shorter than a cycle T of the analog waveform signal. The sampling cycle ts is a cycle from sampling at a certain time point to next sampling, and is a constant normally decided arbitrarily at the time of system design. The cycle T of the waveform signal is a cycle of one wavelength of a waveform amplitude. If a frequency is f, the cycle T is 1/f. If the sampling cycle ts is far shorter than the cycle T of the analog waveform signal, the A/D converter 20 can sample one wave of a waveform signal to obtain many samples. Accordingly, the maximum value ymax of the digital signal is almost equal to the actual maximum value P.

In FIG. 3, by contrast, the cycle T of the analog waveform signal is relatively close to the sampling cycle ts. In this case, the number of samples obtained relative to one wavelength of the waveform signal is small. Due to this, the error increases between the maximum value ymax of the digital signal and the actual maximum value P. Since the sampling cycle ts is asynchronous with the cycle T of the waveform signal, the maximum value ymax hardly coincides with the actual maximum value P.

Figure 4:
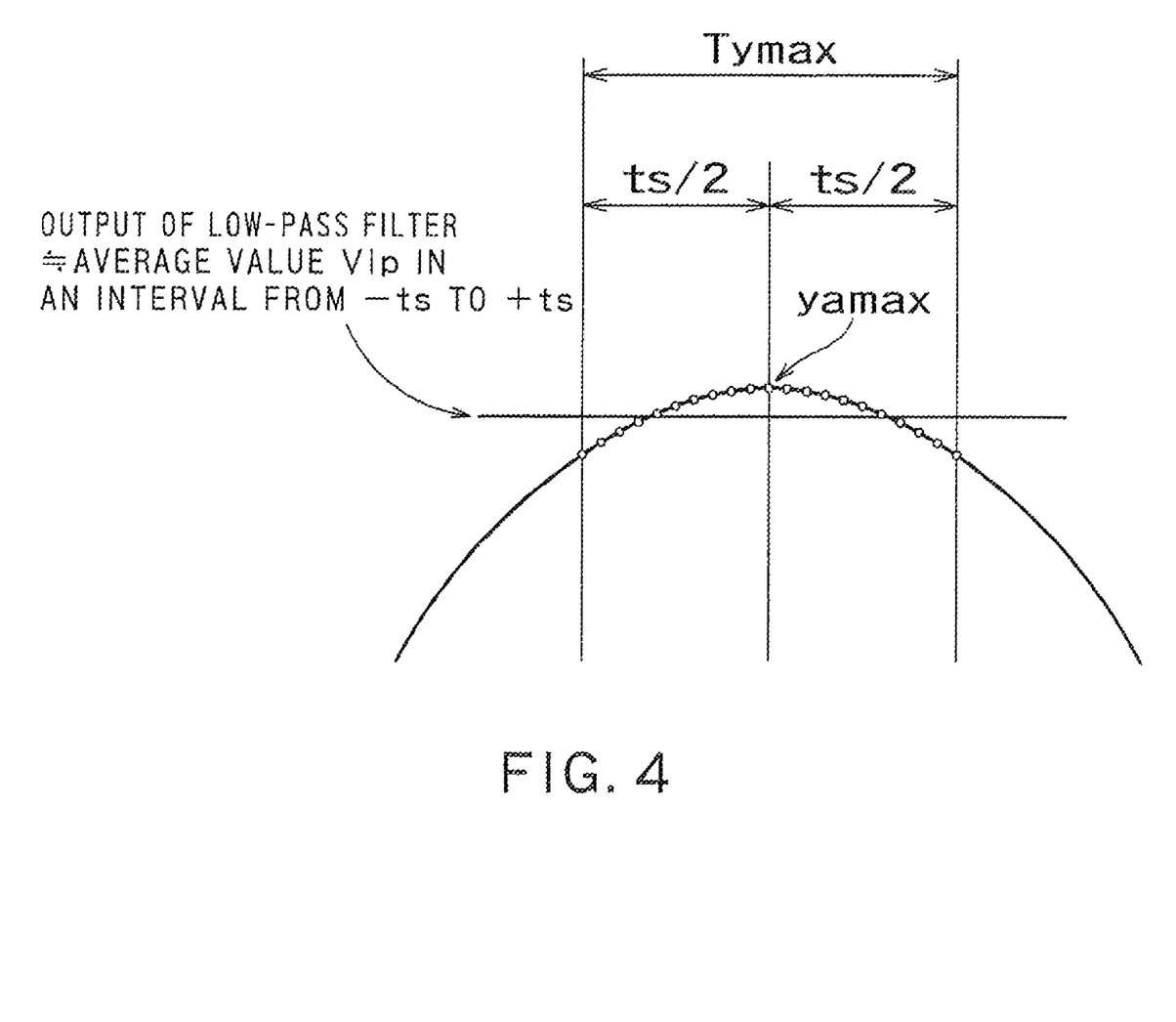
FIG. 4 is a conceptual diagram showing the maximum value ymax of the digital signal after passing through the lowpass filter 34 and the actual maximum value P.

FIG. 4 is a conceptual diagram showing the maximum value ymax of the digital signal after passing through the lowpass filter 34 and the actual maximum value P. As stated, the sampling frequency ts is asynchronous with the cycle T of the waveform signal. Due to this, by sampling many waveform signals, the A/D converter 20 samples one entire wavelength thoroughly. Namely, a probability of sampling a certain part (indicated by a certain sin value) of one wavelength is equal to that of sampling the other part (indicated by the other sin value).

Even in an interval of the sampling cycle ts centering around the actual maximum value P (an interval Tymax from −ts/2 to +ts/2 centering around a time point of P), sampling probabilities are equal. Further, the maximum value ymax input to the lowpass filter 34 is always present in the interval of the sampling cycle ts centering around the actual maximum value P. Accordingly, the maximum value ymax input to the lowpass filter 34 is acquired at any time point in the interval Tymax with an equal probability. Using this fact, the value of the maximum value ymax after passing through the lowpass filter 34 can be estimated. Namely, it is possible to estimate that an average value of the maximum values ymax sampled in the interval Tymax is almost equal to the value of the maximum value ymax after passing through the lowpass filter 34. This estimation can be considered to be correct because the maximum value ymax after passing through the lowpass filter 34 is stable without sudden change. Needless to say, more sampled maximum values ymax are better. If the number of the sampled maximum value ymax is sufficiently large, the average value of the maximum values ymax sampled in the interval Tymax is equal to that of analog waveform signals (sin signals) in the interval Tymax.

Therefore, the following Equation (1) is satisfied in this case.

$$Vlp = \frac{1}{ts}\int_{T/4-ts/2}^{T/4+ts/2} P\mathrm{Sin}\left[2\pi\frac{t}{T}\right]dt \qquad \text{Equation (1)}$$

In the Equation (1), symbol Vlp indicates the average value of the maximum values ymax sampled in the interval Tymax (almost equal to the maximum value ymax output from the lowpass filter 34). Symbol P indicates the actual maximum value of the waveform amplitude. Symbol T indicates the cycle (in seconds) of the sine wave. Symbol ts indicates the sampling cycle (in seconds). If the Equation (1) is solved for the actual maximum value P, the following Equation (2) can be obtained.

$$P = \frac{\pi ts}{T\mathrm{Sin}\left[\frac{\pi ts}{T}\right]} Vlp \qquad \text{Equation (2)}$$

If a correction coefficient for the average value Vlp is A, that is, if A is replaced by the following Equation (3), the Equation (2) can be expressed as the following Equation (4).

$$A = \frac{\pi ts}{T\mathrm{Sin}\left[\frac{\pi ts}{T}\right]} \qquad \text{Equation (3)}$$

$$P = A \times Vlp \qquad \text{Equation (4)}$$

As shown in the Equation (4), if the average value Vlp is multiplied by the correction coefficient A, the actual maximum value P can be obtained.

The correction coefficient A is expressed using the sampling cycle ts and the frequency T of the waveform signal (sin wave). The sampling cycle ts is a preset value. Therefore, if the cycle T of the waveform signal (sin wave) is known, the correction coefficient A can be actually obtained. Accordingly, the cycle detector 35 detects the cycle T of the waveform signal and the correction coefficient generator 37 generates the correction coefficient A as shown in FIG. 1.

The cycle detector 35 receives a plurality of digital signals (cos signal and sin signal), and detects the cycle of one of or each of the cos signal and the sin signal. More specifically, the cycle detector 35 can detect the cycle of one of or each of the cos signal and the sin signal according to changes in signs of the digital signals obtained by a plurality of sampling operations. For example, an interval in which the sin signal is kept to be a positive value or a interval in which the sin signal is kept to be a negative value corresponds to a half cycle. It, therefore, suffices that the cycle detector 35 measure an interval from a time point when the sin signal changes from the negative value to the positive value to a time point when the sin signal changes from the positive value to the negative value, or an interval from a time point when the sin signal changes from the positive value to the negative value to a time point when the sin signal changes from the negative value to the positive value. That is, it suffices that the cycle detector 35 measures the interval in which the sign of the sin signal is constant. This measurement can be easily made by multiplying the sampling cycle ts by the number of sampling operations. If the measured interval is doubled, the cycle T can be obtained. The cycle detector 35 can detect the cycle T using the cos signal similarly to the use of the sin signal.

The correction coefficient generator 37 receives the cycle T from the cycle detector 35. The correction coefficient generator 37 generates a numeric value of the correction coefficient A expressed by a calculation with respect to the cycle T of the waveform signal and the sampling cycle t. To generate the correction coefficient A, the correction coefficient generator 37 can calculate the Equation (3) using the cycle T. If the correction coefficient generator 37 is the general-purpose CPU, the Equation (3) is calculated by the CPU and the program. Alternatively, if the correction coefficient generator 37 is the logic circuit such as the ASIC or FPGA, the Equation (3) is calculated by the logic circuit. The Equation (3) itself can be expressed by the logic circuit. In this case, however, the logic circuit may possibly be larger in scale.

Figure 5:
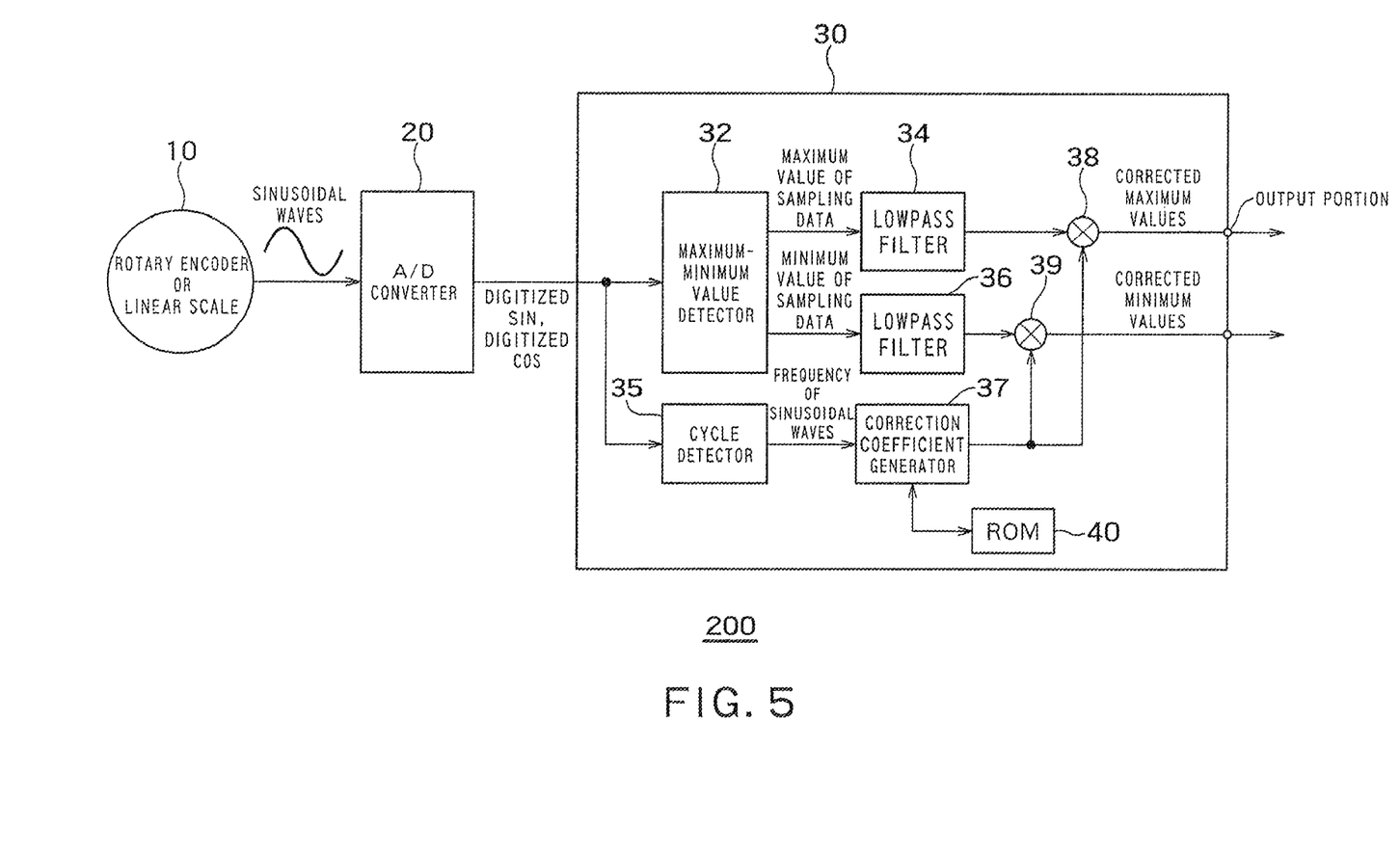
FIG. 5 is a block diagram showing of a position detection apparatus 200 including a memory 40.
Figure 6:
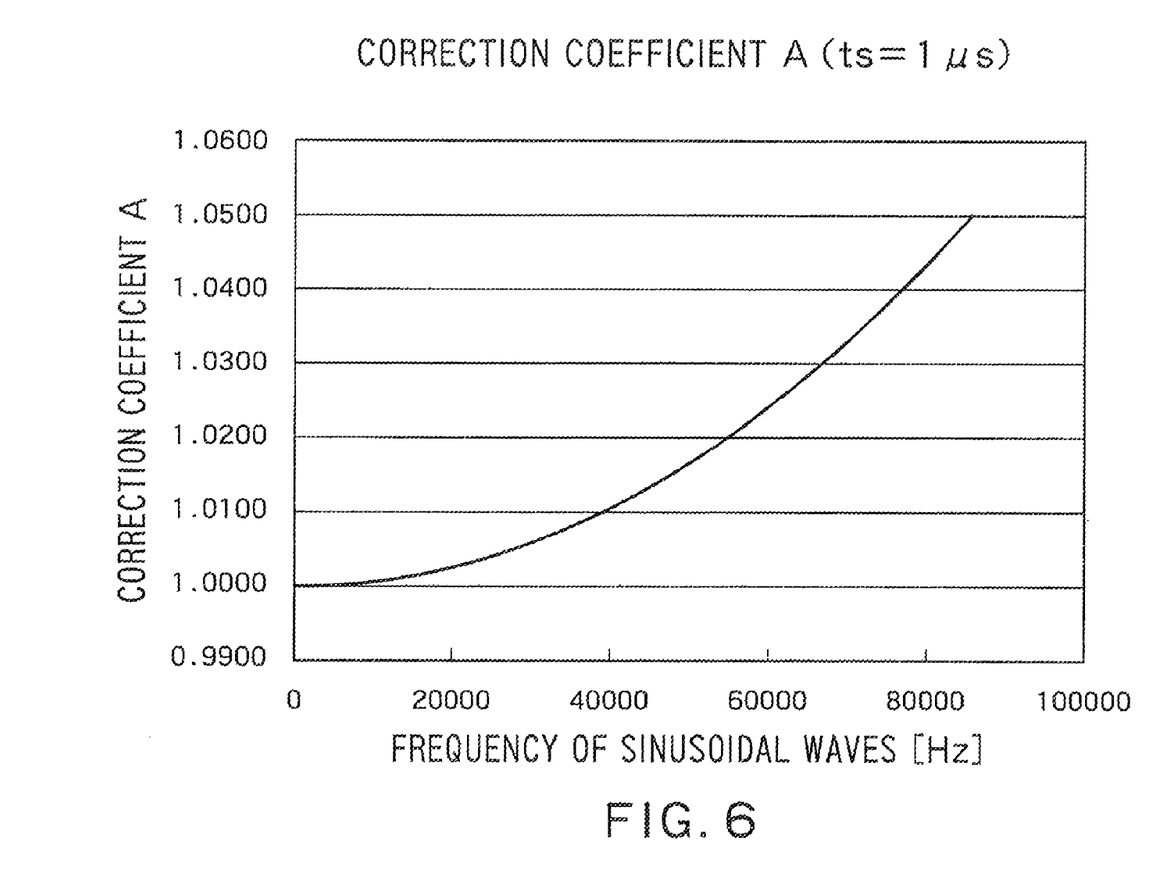
FIG. 6 is a graph showing the correspondence between the cycle T and the correction coefficient A stored in the storage unit 40 if the sampling cycle ts is one microsecond (ts=1 μs)

The amplitude detection apparatus 30 can further include a storage unit 40 storing therein a correspondence relationship between the cycle T of the waveform signal and the correction coefficient A as shown in FIG. 5. Since the sampling cycle ts is the preset value, a one-to-one correspondence is held between the correction coefficient A and the cycle T. FIG. 6 is a graph showing the correspondence between the cycle T and the correction coefficient A stored in the storage unit 40 if the sampling cycle ts is one microsecond (ts=1 μs). The storage unit 40 substantially stores therein the graph shown in FIG. 6. Actually, the storage unit 40 stores therein values of the correction coefficient A corresponding to discrete values of the cycle T. The storage unit 40 is, for example, a ROM (read only memory). To discriminate the actual cycle T obtained by the cycle detector 35 from the cycle T stored in the storage unit 40, the values of the cycle T stored in the storage unit 40 are denoted by Tm (referred to as "cycles Tm").

Figure 9:
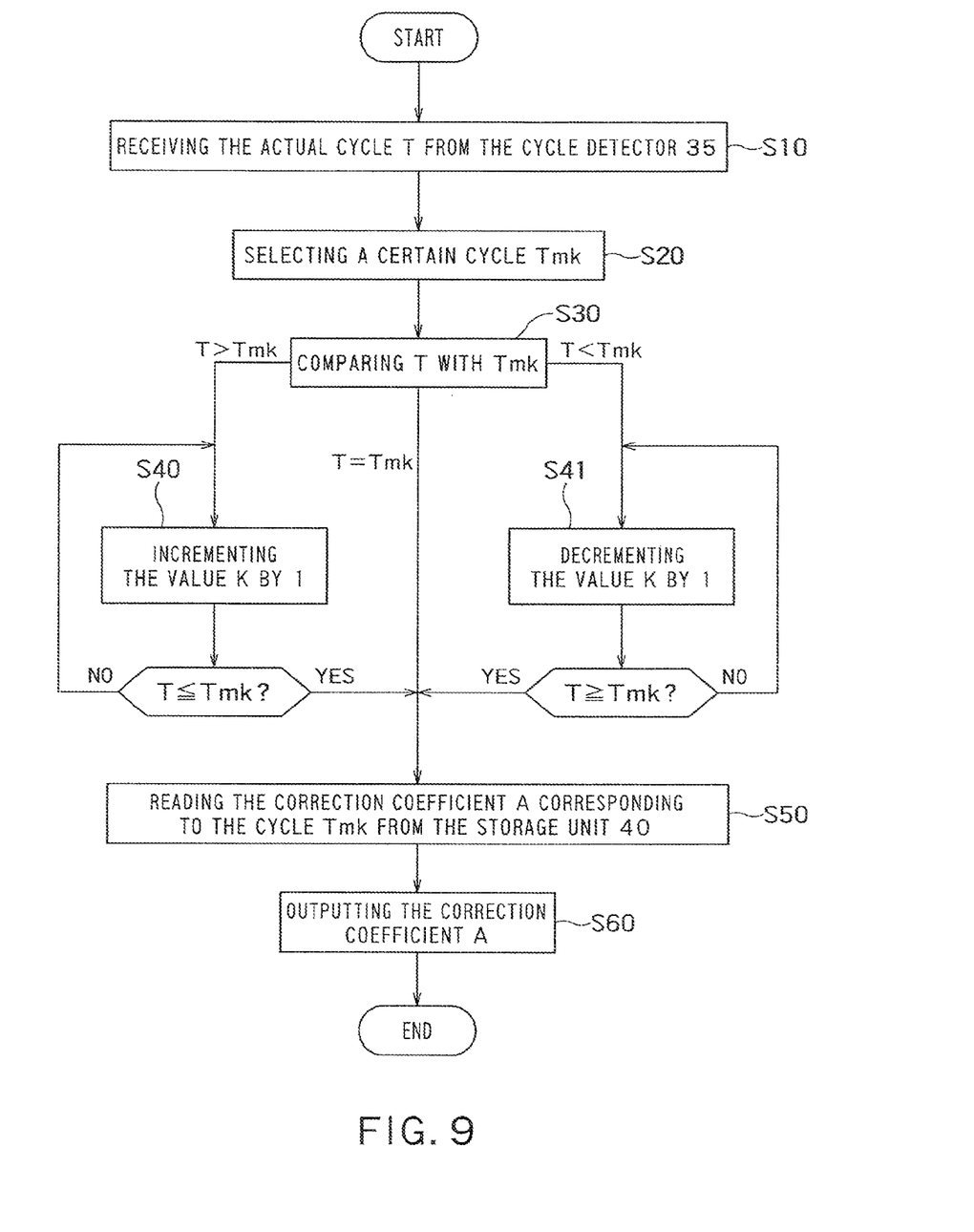
FIG. 9 is a flowchart showing the operation performed by the correction coefficient generator 37 already stated above.

The correction coefficient generator 37 receives the actual cycle T from the cycle detector 35 (S10). The correction coefficient generator 37 compares the actual cycle T received from the cycle detector 35 with cycles Tm read from the storage unit 40, and selects a cycle Tm closest to the actual cycle T. Further, the correction coefficient generator 37 outputs the correction coefficient A corresponding to the selected cycle Tm. According to this scheme, it suffices that the correction coefficient generator 37 includes a comparator (not shown) comparing the actual cycle T with the cycles Tm as well as a register storing therein the actual cycle T, the cycles Tm that are currently being compared with the actual cycle T, and the correction coefficients A corresponding to the respective cycles Tm. A subtractor can be used as the comparator. The correction coefficient generator 37 configured as stated above can be realized by a circuit smaller in scale than the LSI that is the logic circuit expressing the Equation (3) itself or the general-purpose CPU executing the program expressing the Equation (3) itself. Moreover, it only suffices that the correction coefficient generator 37 repeatedly performs quite simple comparison calculations. Therefore, the correction coefficient generator 37 can generate the correction coefficient A at quite high generation rate.

It is assumed that the storage unit 40 stores therein correction coefficients Ai (where i=1, 2, 3, . . . n) corresponding to the cycles $Tm_i$, respectively. It is also assumed that a value of the cycle $Tm_i$ is larger as the value i is greater. Namely, the following relationship is held: $Tm_1 < Tm_2 < Tm_3 \ldots < Tm_n$.

Initially, the correction coefficient generator 37 selects a certain cycle $Tm_k$ (S20). For example, the correction coefficient generator 37 selects a cycle $Tm_{(n/2)}$ (if n is odd, $Tm_{(n/2)}$ can be expressed as $Tm_{((n-1)/2)}$ or $Tm_{((n+1)/2)}$) as the cycle $Tm_k$.

The comparator compares T with $Tm_k$ (S30). As a result of the comparison, if the cycle T is longer than the cycle $Tm_k$ (if $T-Tm_k$ is positive), the correction coefficient generator 37 increments the value k by 1 (S40). Namely, the correction coefficient generator 37 reads $Tm_k$ longer than the previous $Tm_k$ from the storage unit 40. The comparator compares T with $Tm_k$. As a result of the comparison, if the cycle T is still longer than the cycle $Tm_k$ (if $T-Tm_k$ is still positive), the correction coefficient generator 37 further increments the value k by 1. The correction coefficient generator 37 repeatedly performs the operation. When the cycle $Tm_k$ becomes longer than the cycle T (if $T-Tm_k$ becomes negative), the correction coefficient generator 37 reads the correction coefficient A corresponding to the cycle $Tm_k$ from the storage unit (S50). The correction coefficient generator 37 outputs the correction coefficient A to the multipliers 38 and 39 (S60).

Conversely, if the cycle T is initially shorter than the cycle $Tm_k$ ($T-Tm_k$ is negative), the correction coefficient generator 37 decrements the value k by 1 (S41). Namely, the correction coefficient generator 37 reads $Tm_k$ shorter than the previous $Tm_k$ from the storage unit 40. The comparator compares the decremented $Tm_k$ with T. If T is still shorter than $Tm_k$ (if $T-Tm_k$ is still negative), the correction coefficient generator 37 further decrements the value k by 1. The correction coefficient generator 37 repeatedly performs this operation. When $Tm_k$ becomes shorter than T (if $T-Tm_k$ becomes positive), the correction coefficient generator 37 outputs the correction coefficient A to the multipliers 38 and 39.

If the selected cycle $Tm_k$ is equal to the actual cycle T, the correction coefficient generator 37 outputs the cycle $Tm_k$ to the multipliers 38 and 39 as it is.

Alternatively, the correction coefficient generator 37 can further include a proportional computing unit. It is assumed that the magnitude relationship between Tm and T reverses itself by selecting $Tm_{k-1}$ after selecting $Tm_k$. In this case, the cycle T is between $Tm_{k-1}$ and $Tm_k$. Accordingly, the proportional computing unit estimates that Tm and A linearly change between a coordinate ($Tm_k$, $A_k$) and a coordinate ($Tm_{k-1}$, $A_{k-1}$), and proportionally calculates the correction coefficient A corresponding to the accurate cycle Tm. The correction coefficient generator 37 can thereby calculate the correction coefficient A in more detail.

The multiplier 38 multiplies each of the maximum values ymax and xmax passing through the lowpass filter 34 by the correction coefficient A output from the correction coefficient generator 37. The multiplier 39 multiplies each of the minimum values ymin and xmin passing through the lowpass filter 36 by the correction coefficient A output from the correction coefficient generator 37. As a result, corrected maximum values ycmax and xcmax and corrected minimum values ycmin and xcmin are generated.

The corrected maximum values ycmax and xcmax and the corrected minimum values ycmin and xcmin are close to the actual maximum values and actual minimum values of the analog waveform signals, as compared with the maximum values ymax and xmax and minimum values ymin and xmin before correction. As a result, according to the embodiments, it is possible to obtain amplitudes close to the actual amplitudes of the analog waveform signals using the corrected maximum values ycmax and xcmax or the corrected minimum values ycmin and xcmin. The corrected maximum values ycmax and xcmax can be used as the amplitudes of the respective waveform signals. If the corrected minimum values ycmin and xcmin are used, absolute values of the corrected minimum values ycmin and xcmin can be used as the amplitudes of the respective waveform signals.

If the difference between the actual cycle T of each of the analog waveform signals and the sampling cycle ts is small, the maximum values ymax and xmax and the minimum values ymin and xmin greatly deviate from actual maximum values and actual minimum values, respectively. However, the value of the correction coefficient A also deviates from 1 and the degree of correction increases. This is obvious from the graph of FIG. 6. As a conclusion, even if the difference between the actual cycle T and the sampling cycle ts is small, the amplitude detection apparatuses 100 to 400 according to the embodiments can generate amplitudes close to the actual amplitudes of the respective analog waveform signals. The above-stated description is given on the presumption that the cycle T of the waveform signal is longer than the sampling cycle ts.

However, it is assumed that there is no offset or, if any, the offset is corrected according to the embodiments. The "offset" means a deviation between a reference coordinate and a Lissajous figure, and is a potential difference between a preset reference potential (e.g., zero volt) and an intermediate value between a maximum value and a minimum value of digital signals.

Figure 7:
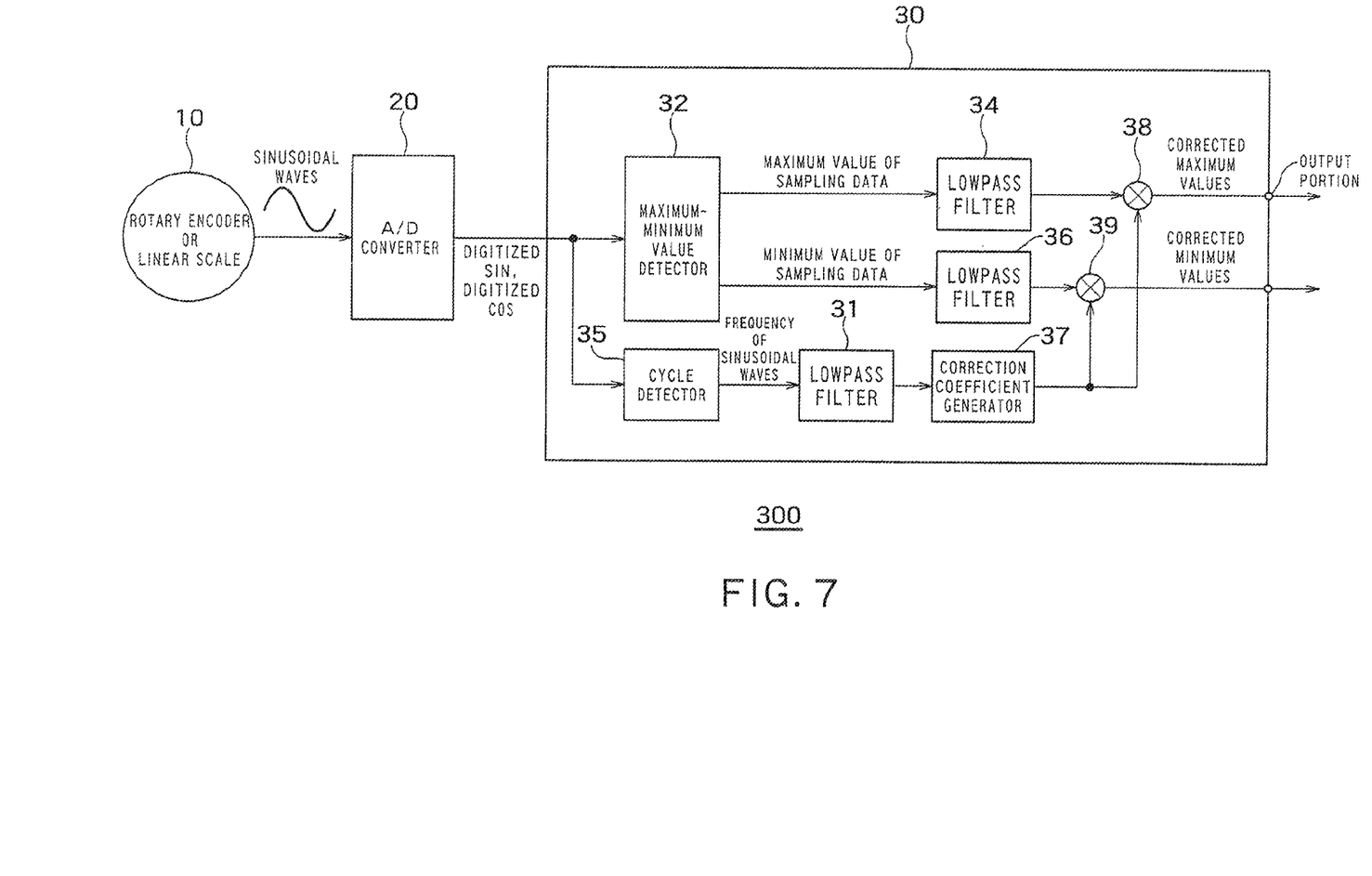
FIG. 7 shows a configuration of a position detection apparatus 300.
Figure 8:
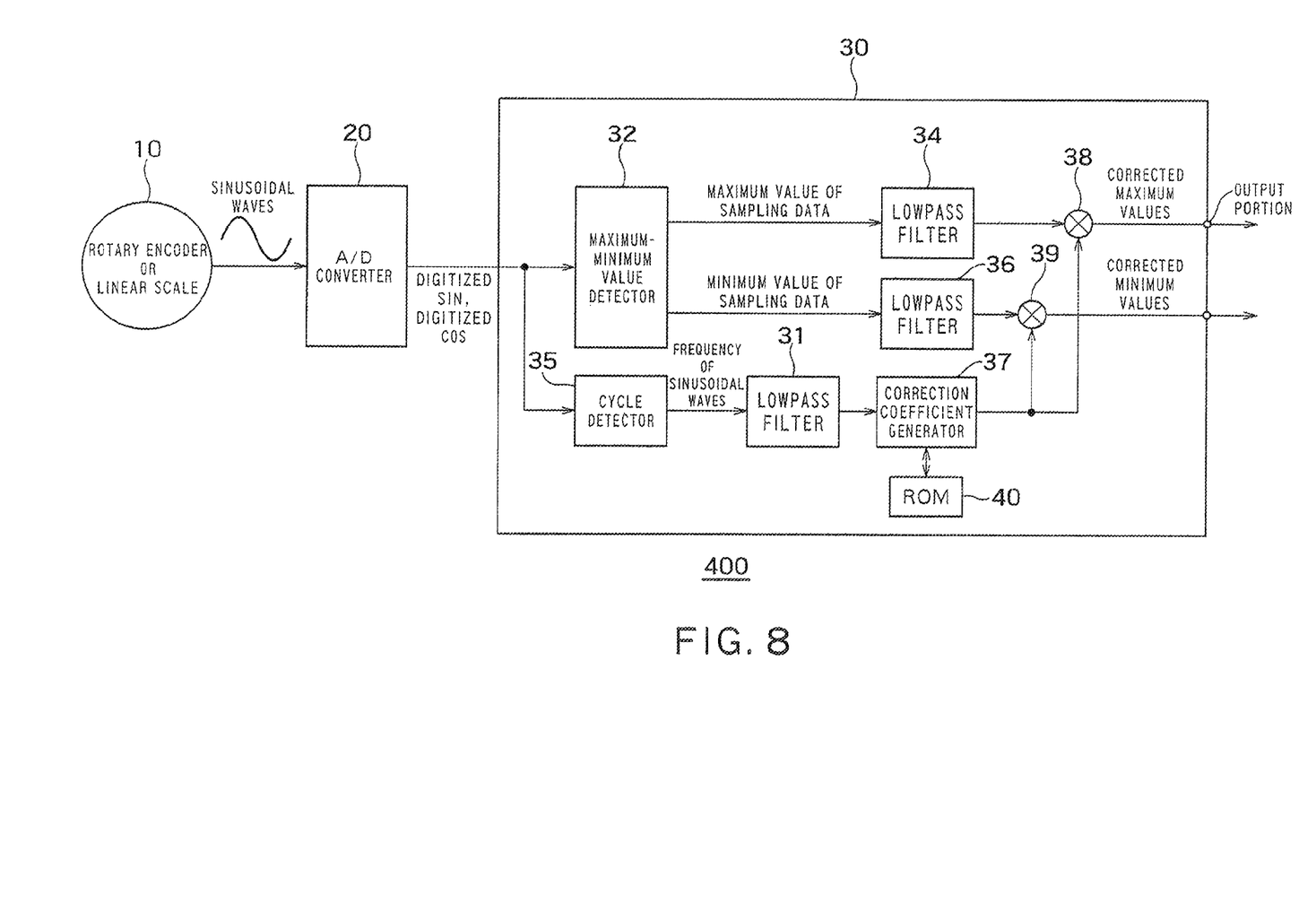
FIG. 8 shows a configuration of a position detection apparatus 400.

FIGS. 7 and 8 show configurations of position detection apparatuses 300 and 400 in each of which the amplitude detection apparatus 30 further includes a lowpass filter 31 between the cycle detector 35 and the correction coefficient generator 37 according to other embodiments of the present invention. The other constituent elements of the amplitude detection apparatuses 30 of the position detection apparatuses 300 and 400 shown in FIGS. 7 and 8 are similar to those shown in FIGS. 1 and 5, respectively. A cutoff frequency of the lowpass filter 31 is lower than the frequencies of the waveform signals. It is undesirable that the cycle T of the sine wave has sudden and sharp change. By providing the lowpass filter 31 as shown in FIGS. 7 and 8, the cycle T can be stabilized.

FIG. 9 is a flowchart showing the operation performed by the correction coefficient generator 37 already stated above. By constituting the algorithm shown in FIG. 9 using the ASIC or FPGA, the correction coefficient generator 37 can be realized by the logic circuit.

The invention claimed is:

1. An amplitude detection apparatus for periodically sampling a waveform signal indicating an angle or a position of a moving body making a rotational movement or a reciprocating movement, and for detecting an amplitude of the waveform signal based on digital signals obtained by sampling, comprising:
   a maximum-minimum value detector detecting a maximum value and a minimum value of the digital signals by using a digital signal at a certain time point and digital signals obtained by the sampling before the certain point;
   a first lowpass filter having a cutoff frequency lower than a frequency of the waveform signal, and stabilizing the maximum value of the digital signals;
   a second lowpass filter having a cutoff frequency lower than the frequency of the waveform signal, and stabilizing the minimum value of the digital signals;
   a cycle detector detecting a cycle of the waveform signal from a plurality of the digital signals;
   a correction coefficient generator generating a numeric value of a correction coefficient expressed by a calculation with respect to the cycle of the waveform signal and a cycle of the sampling;
   a first multiplier generating a corrected maximum value by multiplying the maximum value of the digital signals by the correction coefficient;
   a second multiplier generating a corrected minimum value by multiplying the minimum value of the digital signals by the correction coefficient; and
   an output portion outputting at least one of the corrected maximum value and an absolute value of the corrected minimum value as the amplitude of the waveform signal
   wherein
   the correction coefficient generator calculates a correction coefficient A as:

$$A = \frac{\pi ts}{T \mathrm{Sin}\left[\frac{\pi ts}{T}\right]}$$

where ts indicates the cycle of the sampling, T indicates the cycle of the waveform signal, and
   the correction coefficient generator transmits the correction coefficient A to the first multiplier and the second multiplier.

2. The amplitude detection apparatus according to claim 1, further comprising a storage portion storing therein a correspondence relationship between the cycle of the waveform signal and the correction coefficient with respect to a predetermined cycle of the sampling, wherein the correction coefficient generator reads the correction coefficient corresponding to the cycle of the waveform signal detected by the cycle detector from the storage portions and transmits the correction coefficient to the first multiplier and the second multiplier.

3. The amplitude detection apparatus according to claim 1, wherein the cycle detector measures an interval in which a sign of one of a sin signal and a cos signal included in the digital signals is constant, and calculates the cycle of the waveform signal using the measured interval.

4. The amplitude detection apparatus according to claim 2, wherein the cycle detector measures an interval in which a sign of one of a sin signal and a cos signal included in the digital signals is constant, and calculates the cycle of the waveform signal using the measured interval.

5. The amplitude detection apparatus according to claim 1, wherein the cycle detector measures an interval in which a sign of one of a sin signal and a cos signal included in the digital signals is constant, and calculates the cycle of the waveform signal using the measured interval.

6. The amplitude detection apparatus according to claim 1, further comprising a third lowpass filter provided between the cycle detector and the correction coefficient generator, the third lowpass filter having a cutoff frequency lower than the frequency of the waveform signal.

7. The amplitude detection apparatus according to claim 2, further comprising a third lowpass filter provided between the cycle detector and the correction coefficient generator, the third lowpass filter having a cutoff frequency lower than the frequency of the waveform signal.

8. The amplitude detection apparatus according to claim 1, further comprising a third lowpass filter provided between the cycle detector and the correction coefficient generator, the third lowpass filter having a cutoff frequency lower than the frequency of the waveform signal.

9. The amplitude detection apparatus according to claim 3, further comprising a third lowpass filter provided between the cycle detector and the correction coefficient generator, the third lowpass filter having a cutoff frequency lower than the frequency of the waveform signal.

10. The amplitude detection apparatus according to claim 1, wherein the amplitude detection apparatus is arranged in a rotary encoder or a linear scale.

11. The amplitude detection apparatus according to claim 1, wherein the correction coefficient generator is constituted by a logic circuit.

* * * * *